United States Patent
Saravis

(10) Patent No.: US 9,836,101 B1
(45) Date of Patent: Dec. 5, 2017

(54) COOLING MOUNT

(71) Applicant: Darren Saravis, Long Beach, CA (US)

(72) Inventor: Darren Saravis, Long Beach, CA (US)

(*) Notice: Subject to any disclaimer, the term of this patent is extended or adjusted under 35 U.S.C. 154(b) by 14 days.

(21) Appl. No.: 14/939,781

(22) Filed: Nov. 12, 2015

Related U.S. Application Data

(60) Provisional application No. 62/078,085, filed on Nov. 11, 2014.

(51) Int. Cl.
  *G06F 1/20* (2006.01)
  *H05K 7/20* (2006.01)

(52) U.S. Cl.
  CPC .............. *G06F 1/203* (2013.01); *G06F 1/206* (2013.01); *H05K 7/20172* (2013.01)

(58) Field of Classification Search
  CPC ....... G06F 1/203; G06F 1/1626; G06F 1/1632
  USPC ................. 361/679.02, 679.03, 679.41, 695; 454/184
  See application file for complete search history.

(56) References Cited

U.S. PATENT DOCUMENTS

| | | | | |
|---|---|---|---|---|
| 8,496,213 | B1* | 7/2013 | Kunert | B41J 29/02 248/176.1 |
| 8,775,710 | B1* | 7/2014 | Miller | G06F 1/1626 361/679.17 |
| 2008/0037213 | A1* | 2/2008 | Haren | G06F 1/203 361/679.46 |
| 2013/0235520 | A1* | 9/2013 | Huang | G06F 1/1632 361/679.48 |

OTHER PUBLICATIONS https://sportstechnologyblog.com/2013/11/11/designing-an-ipad-cooling-case/; Sports Technology Blog—Enabling technologies for sport and health; printed from website Jun. 15, 2016; 4pp.

* cited by examiner

*Primary Examiner* — Tuan T Dinh
*Assistant Examiner* — Mukund G Patel
(74) *Attorney, Agent, or Firm* — Avyno Law P.C.

(57) ABSTRACT

A cooling mount for portable electronic devices is provided that includes a cooling unit for preventing portable electronic devices housing the cooling mount from reaching critical temperatures during operation to avoid undesired shut down of the electronic device.

10 Claims, 12 Drawing Sheets

COOLING MOUNT

CROSS-REFERENCE TO RELATED APPLICATIONS

This application claims priority of U.S. Provisional Application Ser. No. 62/078,085, filed on Nov. 11, 2014, titled PORTABLE TABLET COOLING DEVICE, which application is incorporated by reference in this application in its entirety.

FIELD OF THE INVENTION

The invention relates to a cooling mount for portable electronic devices.

BACKGROUND OF THE INVENTION

Portable electronic devices, including tablets, such as iPADs, iPAD Airs and iPAD minis; smart phones, such as iPhones and Android phones; cell phones; and personal computers are typically powered by a battery, so that users may carry them about and use them as needed, including when operating a vehicle, such as an aircraft, boat or car. Frequently, these devices provide navigation information to users, and for many, such a device has become a required navigational item. When used to guide the operation of land, water and aircraft, it can become problematic if the device is exposed to extreme heat or direct sunlight. The screen of the device, being almost completely black, can get extremely hot if left in direct sun. As a protective measure, the device will shut itself down upon reaching a critical temperature and stay shut down until it cools off. The primary reason for this is to protect the tablet's internal battery. If the device is the primary source for navigation, it can become problematic and/or dangerous to the user if the device shuts down during use. Currently, the user's only option is to get the device to a cooler environment and lower its internal temperature, usually by removing it from direct sunlight. Once the device's internal temperature lowers, it may automatically switch back on, but in the interim there is nothing else for the user to do except to keep the device out of the sun.

SUMMARY OF THE INVENTION

The current invention relates to a cooling mount for portable electronic devices, including, but not limited to, tablets, such as iPADs, iPAD Airs and iPAD minis; smart phones, such as iPhones and Android phones; cell phones; and personal computers that will not only extend product life, but also prevent critical temperature shutdowns and general overheating of the device, which can make user contact uncomfortable or even dangerous. As illustrated and explained further below, the present invention is a cooling mount that provides forced air across the rear of the portable electronic device using fans and either internal battery power or external power.

In one implementation, the invention consists of a polygonal housing made of a rigid material having a front face in the general shape of a portable electronic device for mounting the electronic device on the cooling mount. The housing has a back portion and four sidewalls. The back portion contains two battery housings, a circuit board and electric fans. The cooling mount is constructed so that the portable electronic device, when engaged within the cooling mount, is held away from the back, permitting air flow from the fans to circulate across the back of the electronic device to lower its internal temperature.

Optionally, the invention can include a device for fastening the cooling mount to objects. For example, the cooling mount may include a strap for attaching the mount to a user's leg or to clamp for attaching the cooling mount to various objects within a cabin or cockpit, on a dash board or on objects in the area immediately surrounding the user.

The invention may also optionally include a probe with a temperature-sensitive head that mounts onto the back of a portable electronic device when it is engaged within the cooling mount. The temperature-sensitive probe can detect with the when the ambient temperature or the temperature of the portable electronic device reaches a certain predetermined level and initiate cooling of the device.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention.

DETAILED DESCRIPTION

As illustrated in FIGS. 1-12, the current invention relates to a cooling mount 100 for portable electronic devices 102 that will not only extend product life, but also prevent critical temperature shutdowns and general overheating of the devices 102. As illustrated and explained further below, the cooling mount 100 of the present invention houses a portable electronic device 102 in a manner that allows for air flow across the rear of the device 102 to cool the electronic device during use. In one example implementation, fans, powered by internal and/or external power sources, may be used in the cooling mount to produce airflow across the back of the device. As further illustrated below, the cooling mount may include a mechanism for fastening the cooling mount to a person or object, may include an external power source for use as primary or back-up power supply and may also include a temperature probe for monitoring the temperature of the electronic device and/or air surrounding the device and initiating air flow when predetermined temperatures are detected.

Figure 1:
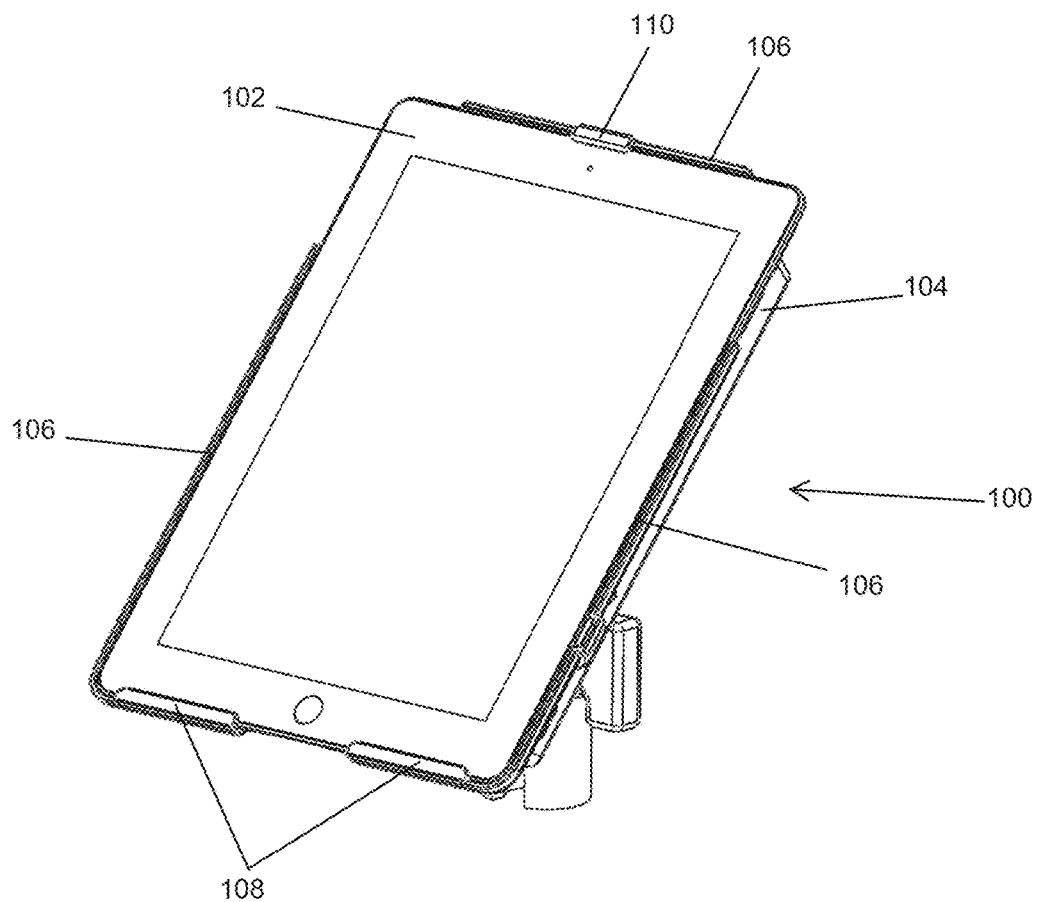
FIG. 1 is a perspective view of one example of an implementation of a cooling mount of the present invention as is appears engaged with a tablet.

FIG. 1 is a perspective view of one example of an implementation of a cooling mount 100 of the present invention as it appears engaged with a portable electronic device 102, which in this example, is a tablet. As illustrated in FIG. 1, the cooling mount 100 includes a generally polygonal shaped housing 104 made of a general rigid material having a front face of the general shape of a portable electronic device 102. Although the portable electronic device 102 in FIG. 1 is a tablet, such as an iPAD, the present invention can be designed of varying sizes and shapes to engage other types and sizes of portable electronic devices 102, such smart phones and personal computers. Further the cooling mount 100 may include adapters (not shown) for accommodating various types of the devices without modifying the overall design.

While the FIG. 1 shows the cooling mount 100 and portable electronic device 102 in a portrait orientation, the position of cooling mount 100 may easily be changed to a landscape orientation or other orientation, depending on the orientation of the electronic device. Further, although the housing 104 is illustrated as a rectangular polygonal shape, the cooling mount 100 is not so limited in shape and may be designed of any shaping having a front face for mounting the electronic device 102.

The portable electronic device 102 is mounted on the front face of the cooling mount 100. The front face of the cooling mount 100 includes a general raised perimeter 106 having a retaining device 108, 110 for receiving the retaining the portable electronic device 102 on the front face of the cooling mount 100. For example, and as illustrated in FIG. 1, the device 102 may be retained along various points around its perimeter by raised 106, channeled 108 or clipping 110 mechanisms that are positioned along the housing 104 sidewalls securing, hooking and/or clipping the device to the front of the cooling mount 100.

Figure 2:
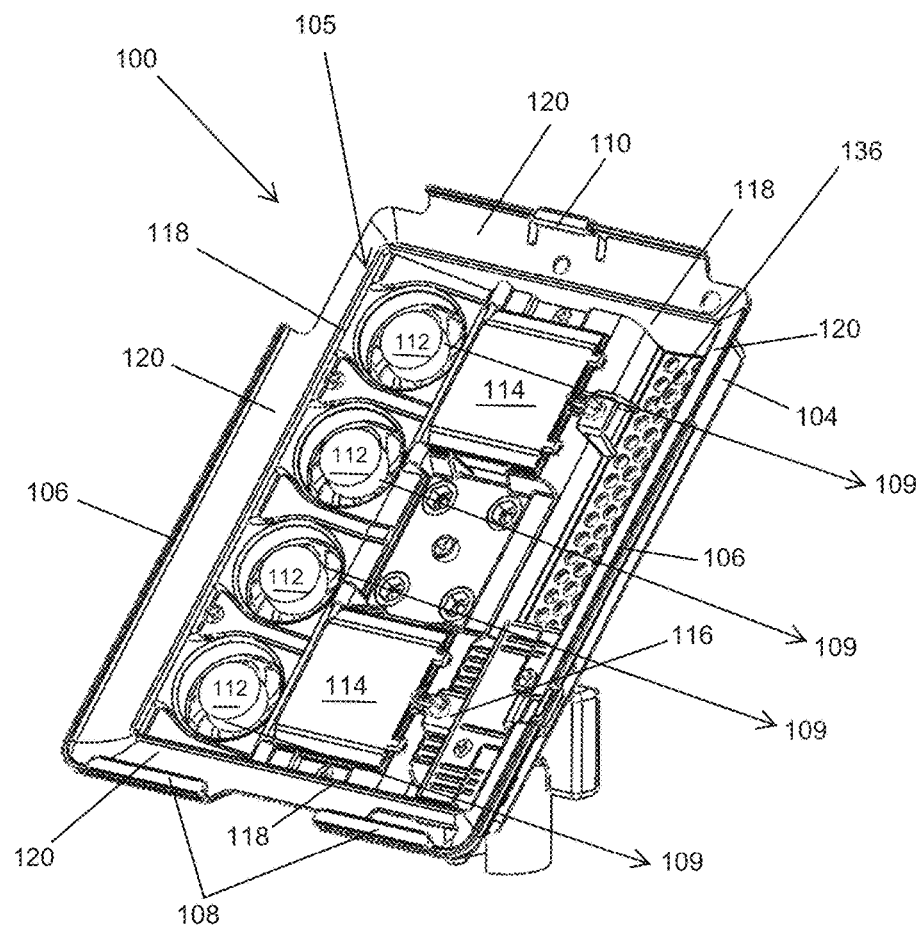
FIG. 2 is a front perspective view of the cooling mount of FIG. 1 with the tablet removed.

FIG. 2 is a front perspective view of the cooling mount 100 of FIG. 1 with the tablet 102 removed. As illustrated in FIG. 2, the cooling mount 100 provides a user with the ability to lower the internal and external temperatures of the device 102 through of a cooling unit 105, which in this is example, is a series of fans 112 that blow across thermodynamically designed airflow paths 109 through ports 136. In this example, the fans 112 are powered by an internal power source 114, which in this example, are batteries within battery housing. An electronic circuit board 116 may also be provided to further control the operation of the fans 112 and optionally provide external power to the fans 112 from an external power source (not shown). Optionally, and as further described below, the electronic circuit board 116 may be in communication with a temperature sensing device 160 for determining when to turn on and/or off the cooling unit 105 and control other functions and features of the mount 100 (e.g., power low light indicator).

As illustrated, in this example, the cooling mount 100 includes generally inwardly angled side walls 120 that converge toward a recessed compartment 118 for housing the cooling unit 105, power supply (i.e. batteries) located within the battery housings 114 and circuit board 116. To allow for cooling unit 105 in the cooling mount 100 to blow air across the airflow paths 109, the portable electronic device 102, when engaged with the cooling mount 100, rests above the fans 112, power supply (i.e. batteries) located within the battery housings 114 and circuit board 116. Accordingly, the cooling unit 105 is positioned in the recessed compartment 118 at the rear of the cooling mount 100 to maintain a predetermined amount of air space between the back of the electronic device 102 and recessed compartment 118.

By having the sides walls 120 angle downwardly and inward toward the recessed compartment 118, the portable electronic device is maintain on the front face of the cooling mount 100, resting against the perimeter edges of the side walls 102 and engaged by raised 106, channeled 108 or clipping 110 mechanisms. Breaks in the sidewalls 120 and the raised 106, channeled 108 or clipping 110 mechanisms allow the portable electronic device 102 to be slid easily into the cooling mount 100 and further permits access to such things as the external power port, on/off switch, microphone, speakers, volume controls and/or other buttons on the top and sides of portable electronic device.

Figure 3:
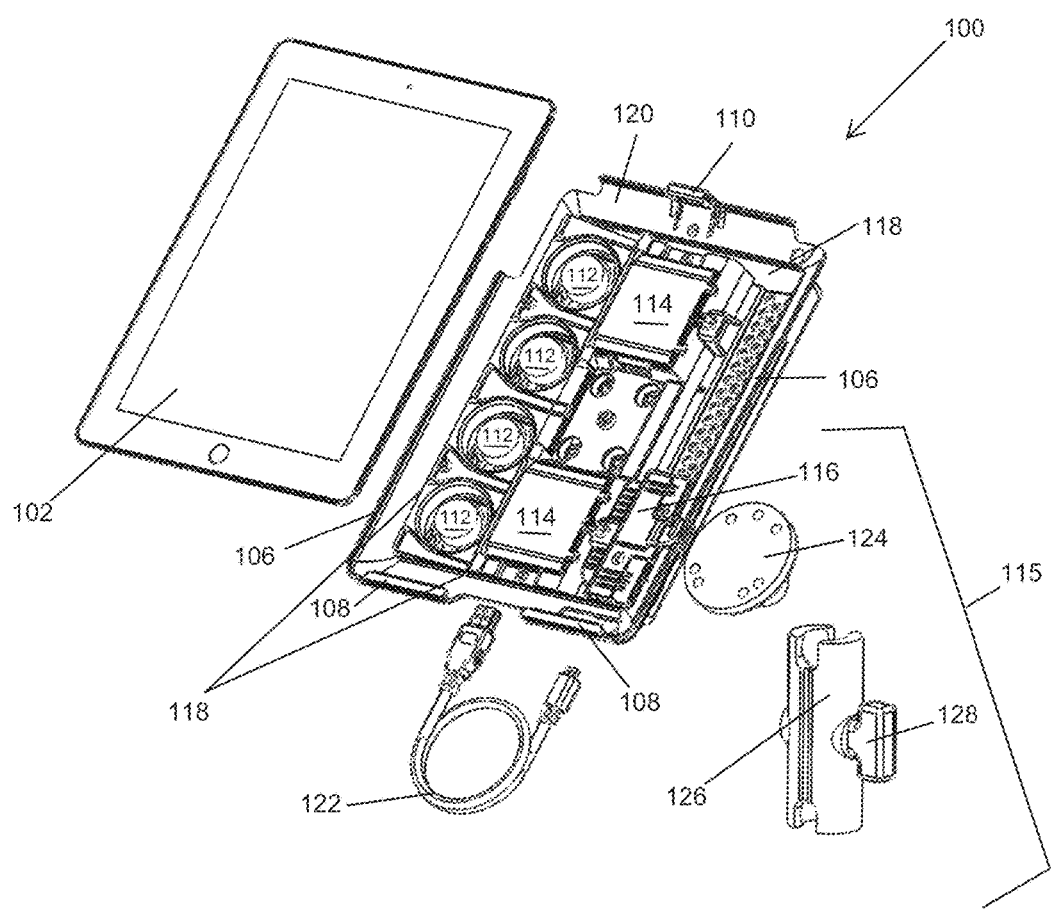
FIG. 3 is an exploded view of the cooling mount of FIG. 1.

FIG. 3 is an exploded view of the cooling mount 100 of FIG. 1 and best illustrates the cooling unit 105 and component parts housed in the recessed compartment 118. Shown from the front are the exposed fans 112, battery housings 114 and circuit board 116. When the portable electronic device 102 is removed, unhinged or unhooked from the invention, access to the internal power source (i.e. batteries) located within the battery housings 114 becomes readily available. This facilitates the quick and easy changing of batteries when power is low during operation. FIG. 3 also illustrates an external power cord 122 that may be used to connect the mount 100 to an external power source, which as illustrated in connection with FIG. 9 below, may be an external battery. Additionally, FIG. 3 illustrates one example of a mounting mechanism 115 that may be connected to the back of the cooling mount 100, as will be further described in connection with FIG. 10 below, for mounting the cooling mount 100 to an object. In this example, the mounting mechanism 115 consisting of a ball pivot mechanism 124, a clamping device 126 into which the ball pivot fits and a nut adjustment assembly 128.

Figure 4:
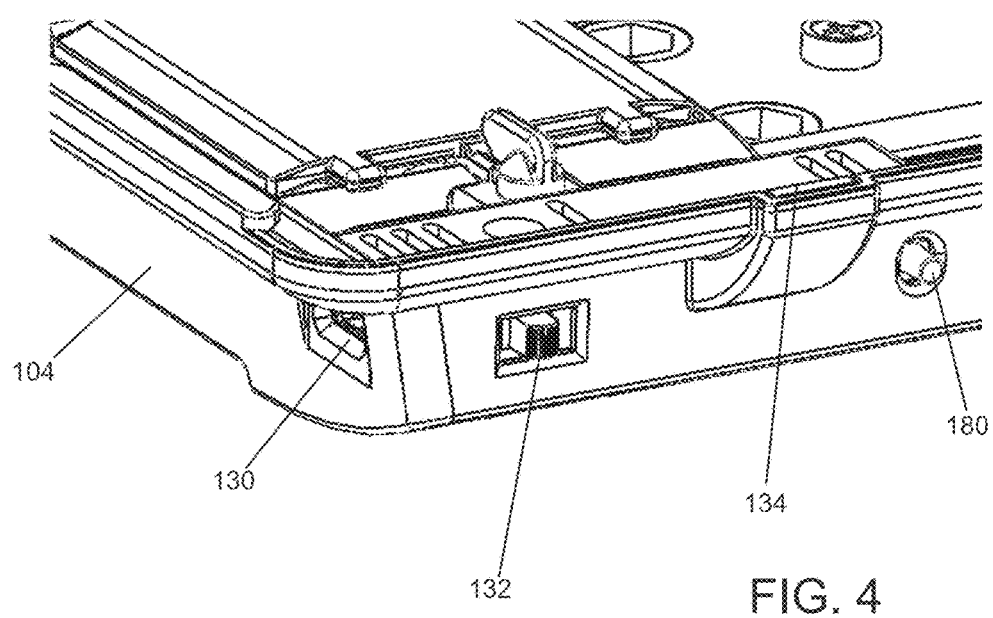
FIG. 4 is a perspective elevation view of the bottom left side of the cooling mount of FIG. 1.

FIG. 4 is a perspective elevation view of the bottom left side of the cooling mount 100 of FIG. 1. FIG. 4 illustrates an external power connection port 130 in the cooling mount housing 104 which may be connected to an external power source in lieu of battery power and a power switch 132 that provides a means for selecting power input source (either internal or external, e.g., USB or internal batteries). External power can be applied to the invention, for example, through a USB or micro USB connector 122 (i.e., power switch-over is initiated by a slide switch). Extended shrouding can protect the micro USB power connector.

FIG. 4 further shows a battery indicator light 134 that in a specific implementation emits a green light if the internal batteries are in a high power condition, a yellow light if the batteries are in a low power condition and a red color if the batteries need to be replaced. However, in other implementations, the indicator can emit any color or wavelength of visible light as desired. FIG. 4 also illustrates a battery test button 180 for the invention that if pushed allows a user to test the strength of the internal batteries. While these components are illustrated as positioned on the bottom left side of the cooling mount 100, those skilled in the art will recognize that these features may be located at various locations along the mount 100.

Figure 5:
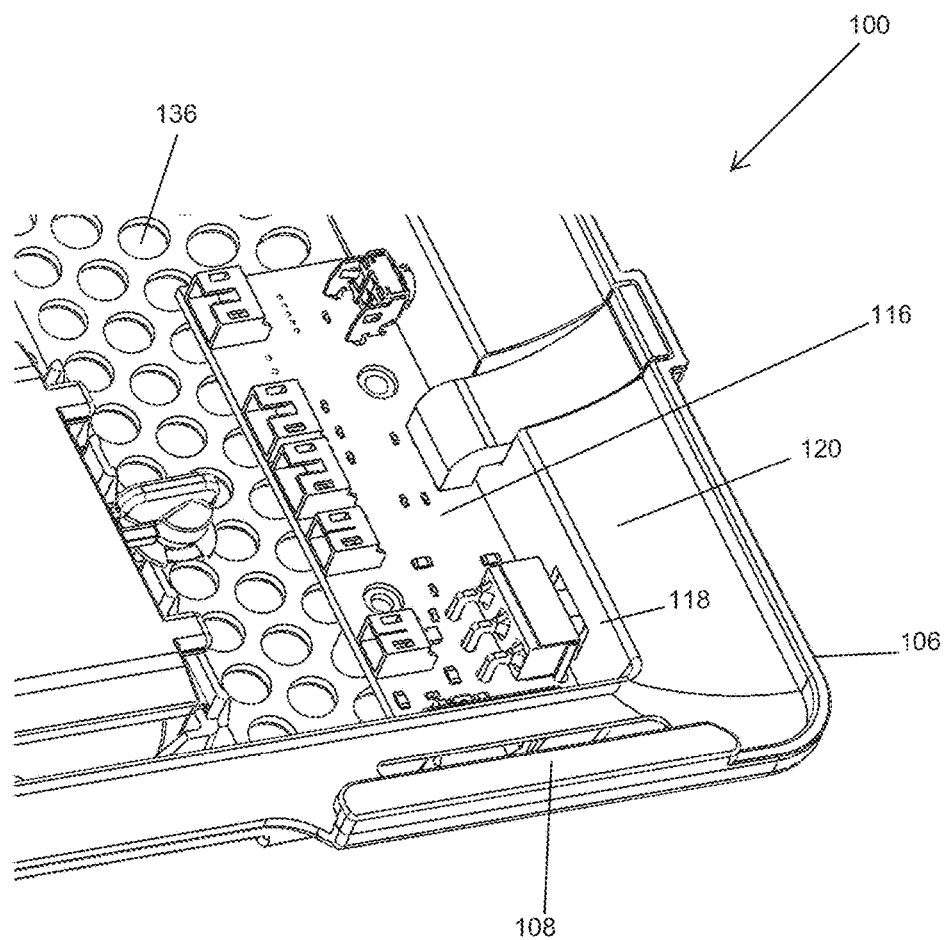
FIG. 5 is a close-up top perspective view the bottom left corner of the cooling mount of FIG. 1.

FIG. 5 is a close-up top perspective view the bottom left corner of the cooling mount 100 of FIG. 1 showing the circuit board 116, the recessed compartment 118 and the side walls 120 and raised 106 and channeled 108 mechanism within or upon which the portable electronic device 102 rests.

Figure 6:
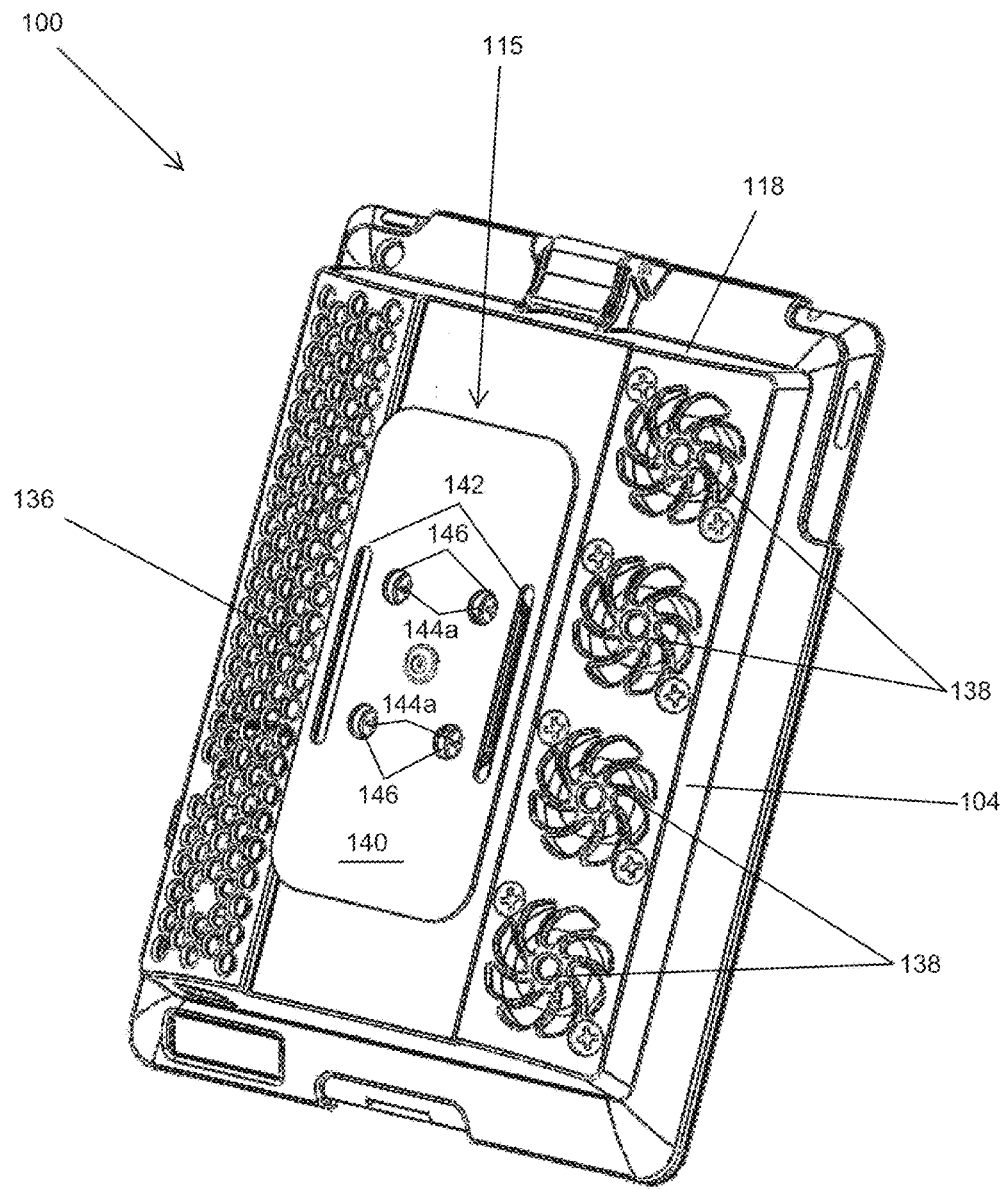
FIG. 6 is a rear perspective view of the cooling mount of FIG. 1.

FIG. 6 is a rear perspective view of the cooling mount 100 of FIG. 1 illustrating the ventilation holes 138 for the fans 112 and one example of a mounting mechanism 115 attached to the cooling mount 100. FIG. 6 best illustrates the recessed compartment 118 of the portable cooling mount 100 which houses the fans 112, battery housings 114 and circuit board 116 outward and away from the back of the electronic device 102. As illustrated in FIG. 6, the recessed compartment 118 includes angled panels for mounting the fans 112 at an inward angle to blow across the cooling mount 100 and the back of the electronic device 100. FIG. 6 illustrates the opposing and angled nature of the series of fans 112 directing air flow across the back of the portable electronic device 102 when inserted into the cooling mount 100. The air from the fans 112 is vented out of holes or ports 136 on the backing of the cooling mount. The ports 136, as illustrated may be positioned on an angled panel opposing the panel for mounting the fans 112. Also illustrated in FIG. 6 is one example of a mounting mechanism 115 for the invention, which in this case is a mounting plate 140 that is affixed to the back of the housing 104 of the cooling mount 100 by fasteners 144a through holes 146 in the mounting plate 140.

Figure 7:
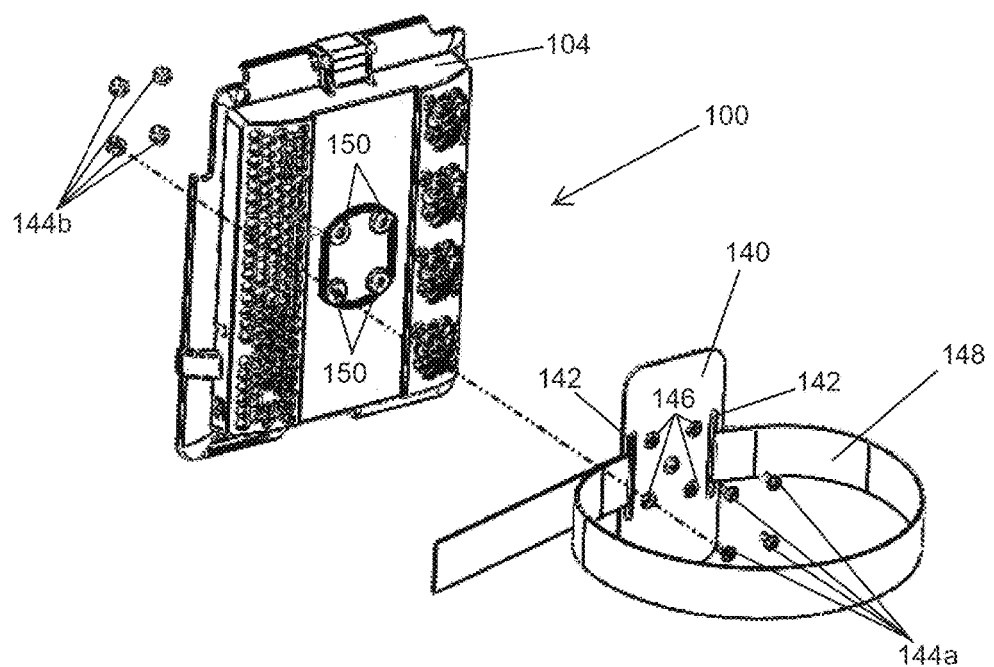
FIG. 7 is a rear perspective exploded view of the cooling mount of FIG. 1 showing one example of a mounting mechanism that may be attached to the back of the cooling mount.

FIG. 7 is a rear perspective exploded view of the cooling mount 100 of FIG. 1 showing one example of a mounting mechanism 115 that may be attached to the back of the cooling mount 100. While various mounting mechanisms 115 may be used to mount the cooling mount 100, in this example, the mounting mechanism 115 is a leg strap 148 for mounting the cool mount 100 to a user's leg. The mounting mechanism 115 includes a mounting plate 140, a leg strap 148 that passes through slots 142 in the mounting plate 140 and fasteners 144a and 144b that pass through holes 146 in the plate 140 for mounting the plate 140 to corresponding holes 150 on the back of the cooling mount 100. The strap 148 may be, for example, an adjustable strap for attaching the cooling mount 100 and portable electronic device 102 directly to a part of the user, such as the user's leg, or, alternative, a large and stable object. The strap 148 may be adjustable and secured by means of Velcro or other fastening device to adjust the position and size of the strap 148 around the object to which it is mounted.

Figure 8:
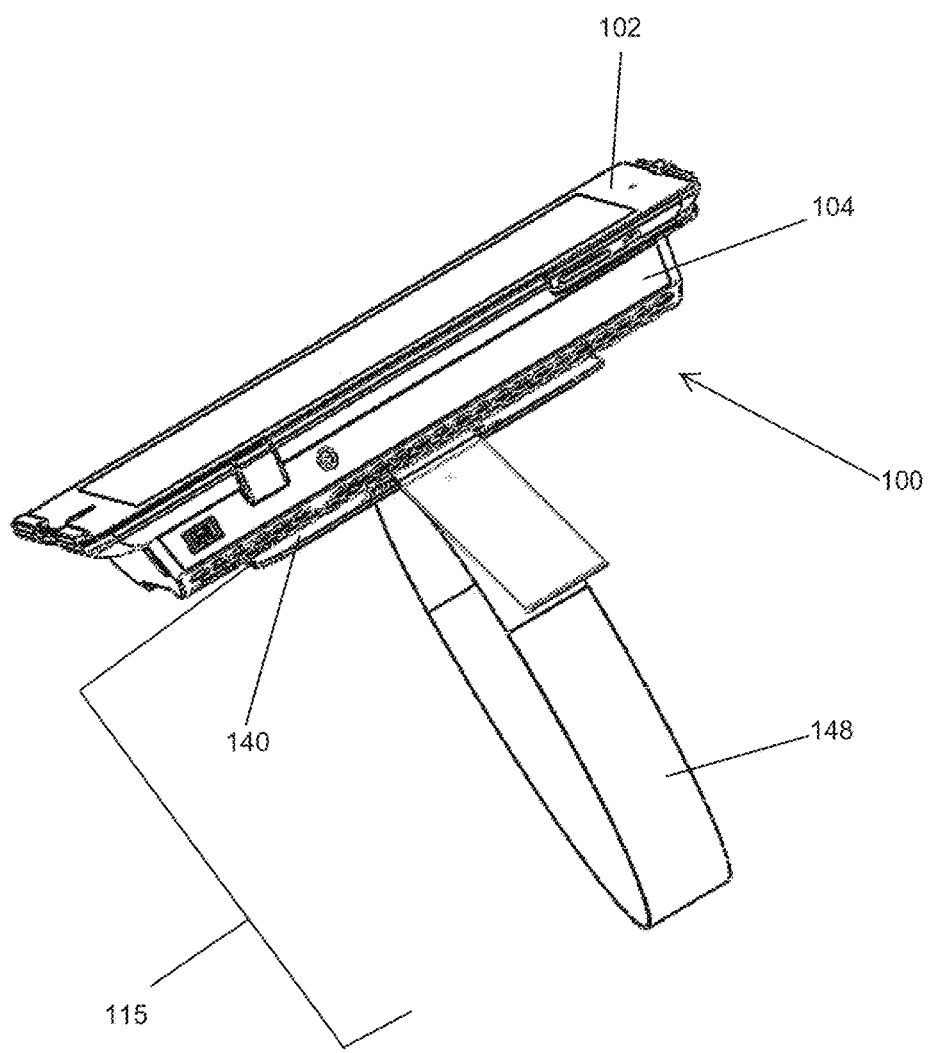
FIG. 8 illustrates a side perspective view of one example of the cooling mount of FIG. 1 having a mounting mechanism attached to the rear of the cooling mount.

FIG. 8 shows the mounting mechanism 115 of FIG. 7 affixed to the back of the housing 104 of the cooling mount 100. In operation, as explained above, the strap 148 attaches the cooling mount 100 and portable electronic device 102 directly to the user (i.e., the user's leg) or to another object.

Figure 9:
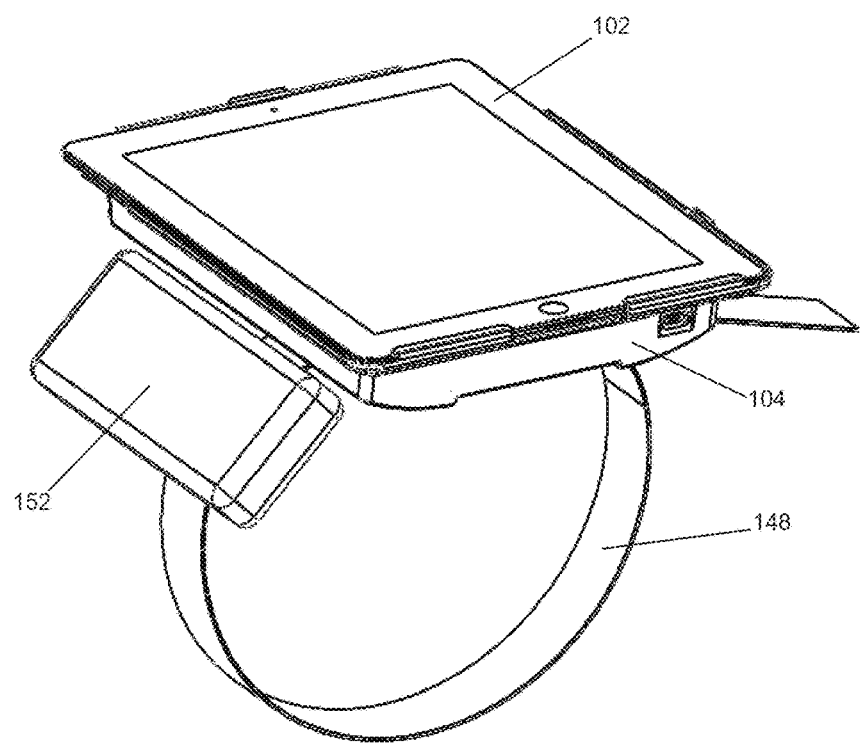
FIG. 9 is a perspective elevation view of the cooling mount of FIG. 1 showing an example of an external power supply mounted onto a mounting mechanism.

FIG. 9 is a perspective elevation view of the cooling mount 100 of FIG. 1 showing an example of an external power supply 152 mounted onto the leg strap 148 of a mounting mechanism 115. Optionally, an external power source, such as battery pack 152, may be utilized to power the cooling mount 100 or, alternative, provide external power for the portable electronic device 102. In this example, the mounting mechanisms 115 for mounting the cooling mount 100 may include an additional feature for holding and supporting an external power supply 152. The external power device may also be mounted onto the back of the portable tablet cooling device (not shown) or at another location on the mounting mechanism 115, such as the mounting plate 140. In use, the internal power source, such as the batteries pack, may also be charged periodically through the power port using an external power supply or the back-up battery pack.

Figure 10:
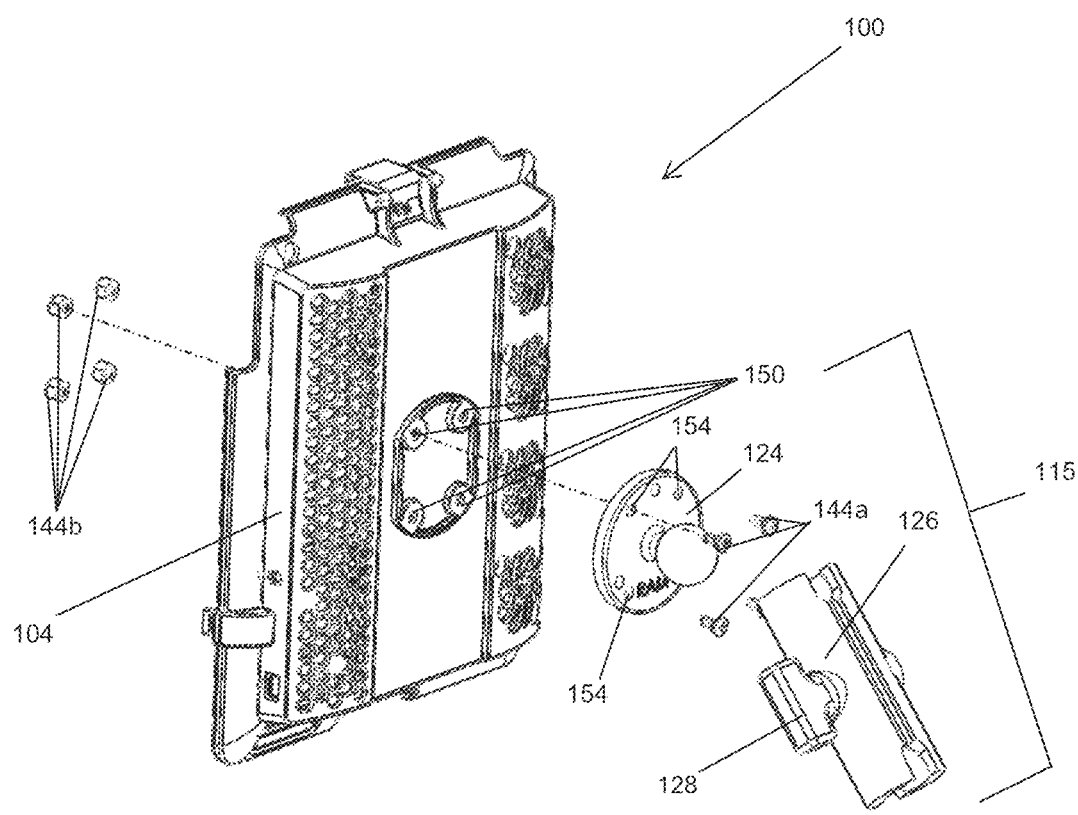
FIG. 10 is a rear perspective exploded view of the cooling mount of FIG. 1 showing an example of another mounting mechanism that may be attached to the back of the cooling mount.

FIG. 10 is a rear perspective exploded view of the cooling mount 100 of FIG. 1 showing another example of a mounting mechanism 115 that may be attached to the back of the cooling mount 100. In this example, the mounting mechanism 115 includes a ball pivot mechanism 124, which can be affixed to the back of the cooling mount housing 104 using fasteners 144a and 144b that pass through holes 154 in the ball joint assembly 124 that engage holes 150 on the back of the housing 104. The ball joint may then snap into a clamping device 126 with a nut adjustment assembly 128 that permits the user to clamp the cooling mount 100 and engaged portable electronic device 102 onto an object within the cabin, cockpit or immediate area surrounding the user (e.g., dashboard) operating a land, air or water vehicle positioned within the reach or vicinity of the user. The ball joint 124 permits the cooling mount 100 and device 102 to be repositioned easily by allowing for a pivotal mount.

Figure 11:
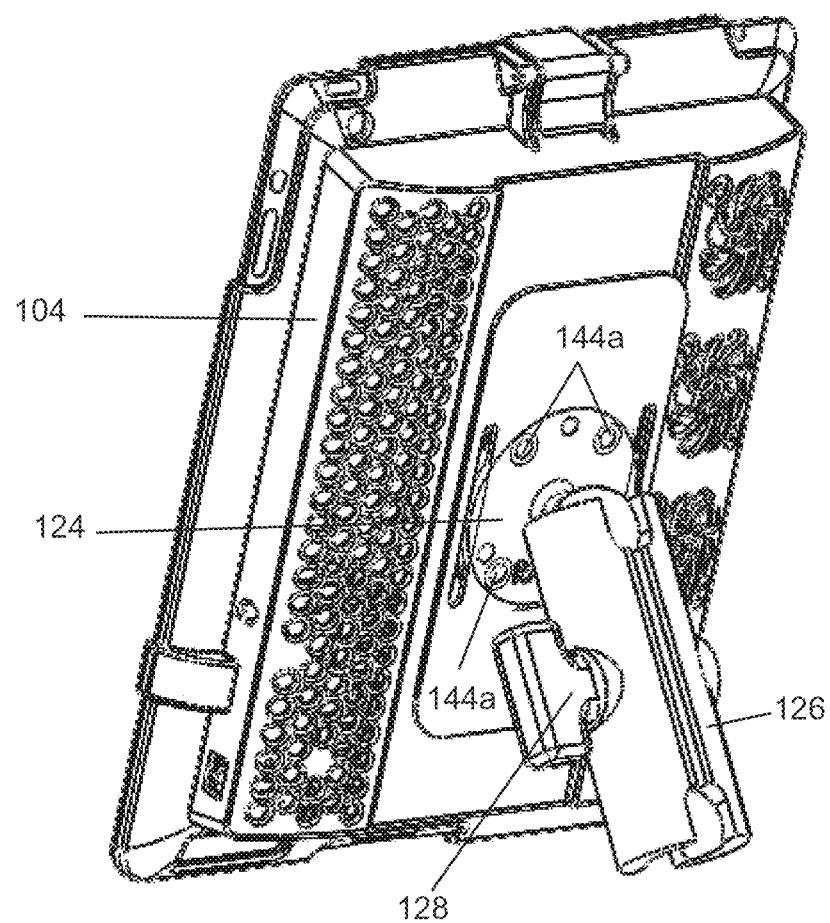
FIG. 11 is a rear perspective view of the cooling mount of FIG. 1 showing the mounting mechanism of FIG. 10 attached to the back of the cooling mount.

FIG. 11 shows the mounting mechanism of FIG. 10, mounted on the rear of the cooling mount housing 104 with fasteners 144a, with its ball joint snapped into the clamping device 126. In this example, the ball joint assembly 140 is mounting to the mounting plate 140 rather than directly to the back of the cooling mount 100. In this manner, the ball joint assembly 140 can be removed to provide access to the leg mount device without requiring the mounting plate of the leg mount to be secured to the cooling mount 100, facilitating easier interchangeability between mounts.

Figure 12:
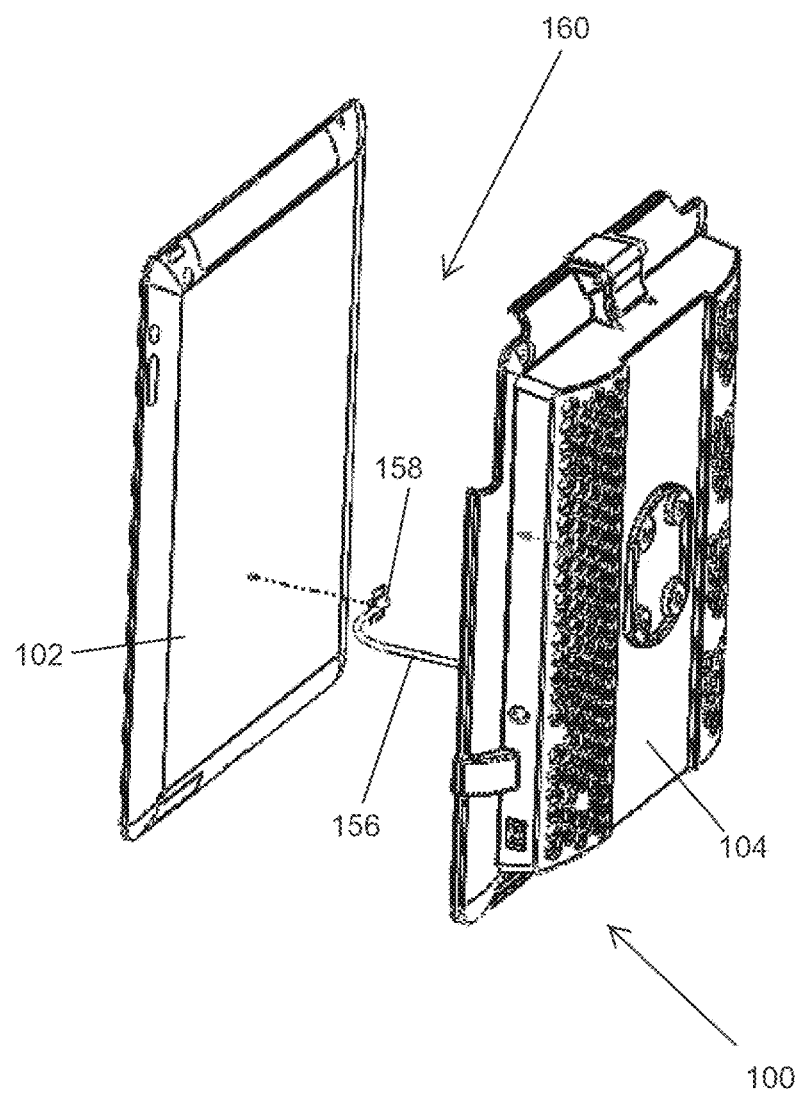
FIG. 12 is rear perspective exploded view of the cooling mount of FIG. 1 having a temperature sensing device for measuring the temperature of the portable electronic device engaged by the cooling mount.

FIG. 12 is rear perspective exploded view of the cooling mount of FIG. 1 having a temperature sensing device 160 for measuring the temperature of the portable electronic device 102 engaged by the cooling mount 100. In this example, a temperature sensing device 160 includes a probe 158 that may be positioned on the back of the portable electronic device 102 for monitoring the temperature of the portable electronic device 102. The temperature sensor or probe 158 may be in electronic communication with cooling unit 105 and may control the operation of the cooling unit 105 based upon measure temperatures of the electronic device 102 and/or the ambient air surrounding the device 102. Controls may trigger the operation of the cooling unit 105 from an on to an off state depending upon the detected temperatures. Optionally, an in other implementations, applications on the electronic device 102 may be also be able to measure the internal and/or external temperature of the device 102 and communicate such temperature information to the cooling mount 100.

Other features may also be optionally implemented into the cooling mount 100 without departing from the scope of the invention. For example, other cooling units or mechanism for cooling the portable electronic device, such as induction cooling, may be used in addition to or in lieu of fans. Depending upon the type of cooling unit, contact may be desired between the electronic device 102 and the cooling unit 105. Further, the cooling mount 100 may include WiFi access, Bluetooth and other hardware and software to facilitate communications between the cooling mount 100 and the portable electronic device 102 and the cooling mount 100 and an internal or external network. Bluetooth, WiFi, radio and or other wired or wireless communications may be established between the portable electronic device 102 and the cooling mount 100 to increase functionality by placing the cooling mount 100 in signal communication with the portable electronic device 102. For example, speakers or other accessories may be included in the cooling mount 100 that are accessible through communication between the portable electronic device 102 and the cooling mount 102.

It will be understood that the term "in signal communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

More generally, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components. For purposes of this application, the hardware and/or software necessary to establish signal communication between two components shall be "communications components."

The foregoing description of an implementation has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A cooling mount for engaging a portable electronic device, the cooling mount comprising a housing having a securing mechanism for mounting an electronic device to the front of the cooling mount, the housing further including a recessed compartment for engaging the back of the electronic device and having at least one inwardly angled panel having a series of fans, wherein the fans are positioned at an inward angle for blowing at least part of the air from one side of the cooling mount to the other side of the cooling mount and across the back of the electronic device when the electronic device is mounted to the cooling mount; wherein the recessed compartment further includes an opposing ported angled panel positioned opposite the at least one inwardly angled panel, wherein the opposing ported angled panel includes a plurality of openings for the output of air blown from the cooling mount in a direction away from the electronic device when the electronic device is mounted to the cooling mount; and a mounting mechanism for mounting the cooling mount to an object, wherein the mounting mechanism includes a clamp mount.

2. The cooling mount of claim 1 further includes a temperature sensor for detecting when the external temperature of the portable electronic device reaches a predetermined temperature.

3. The cooling mount of claim 2 wherein the fans are turned on when the temperature sensor detects the temperature of the device to be at a certain predetermined temperature.

4. The cooling mount of claim 1 wherein the mounting mechanism permits the rotation of the housing of the cooling mount to allow for the portable electronic device to be positioned in either a portrait or a landscape configuration.

5. The cooling mount of claim 1 wherein the cooling mount further includes communication components to enable signal communication with the portable electronic device.

6. A cooling mount for engaging a portable electronic device, the cooling mount comprising a housing having a securing mechanism for mounting an electronic device to the front of the cooling mount, the housing further including a recessed compartment for engaging the back of the electronic device and having at least one inwardly angled panel having a series of fans, wherein the fans are positioned at an inward angle for blowing at least part of the air from one side of the cooling mount to the other side of the cooling mount and across the back of the electronic device when the electronic device is mounted to the cooling mount; wherein the recessed compartment further includes an opposing ported angled panel positioned opposite the at least one inwardly angled panel, wherein the opposing ported angled panel includes a plurality of openings for the output of air blown from the cooling mount in a direction away from the electronic device when the electronic device is mounted to the cooling mount; and a mounting mechanism for mounting the cooling mount to an object, wherein the mounting mechanism includes a strap.

7. The cooling mount of claim 6 further includes a temperature sensor for detecting when the external temperature of the portable electronic device reaches a predetermined temperature.

8. The cooling mount of claim 7 wherein the fans are turned on when the temperature sensor detects the temperature of the device to be at a certain predetermined temperature.

9. The cooling mount of claim 6 wherein the mounting mechanism permits the rotation of the housing of the cooling mount to allow for the portable electronic device to be positioned in either a portrait or a landscape configuration.

10. The cooling mount of claim 6 wherein the cooling mount further includes communication components to enable signal communication with the portable electronic device.

* * * * *